US008817512B2

(12) United States Patent
Kono

(10) Patent No.: US 8,817,512 B2
(45) Date of Patent: Aug. 26, 2014

(54) SEMICONDUCTOR MEMORY DEVICE

(75) Inventor: Fumihiro Kono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 253 days.

(21) Appl. No.: 13/495,366

(22) Filed: Jun. 13, 2012

(65) Prior Publication Data

US 2012/0320651 A1 Dec. 20, 2012

(30) Foreign Application Priority Data

Jun. 14, 2011 (JP) ................ P2011-132606

(51) Int. Cl.
*G11C 7/06* (2006.01)
*G11C 7/18* (2006.01)
*G11C 5/02* (2006.01)

(52) U.S. Cl.
CPC *G11C 7/18* (2013.01); *G11C 5/025* (2013.01); *G11C 7/06* (2013.01)
USPC ..... 365/51; 365/63; 365/185.11; 365/185.17; 365/185.21

(58) Field of Classification Search
USPC ..................................... 365/51, 63
See application file for complete search history.

(56) References Cited

U.S. PATENT DOCUMENTS 5,101,377 A * 3/1992 Yamada ................. 365/51
7,583,524 B2 9/2009 Kang
7,936,004 B2 5/2011 Kito et al.
2009/0003047 A1 1/2009 Toda
2010/0020608 A1 1/2010 Kamigaichi et al.
2010/0109071 A1 5/2010 Tanaka et al.

FOREIGN PATENT DOCUMENTS

| JP | 2007-184084 | 7/2007 |
| JP | 2009-9657 | 1/2009 |
| JP | 2010-34109 | 2/2010 |
| JP | 2010-114113 | 5/2010 |

OTHER PUBLICATIONS

Office Action issued on May 27, 2014 in Japanese Patent Application No. 2011-132606 (with English Translation).

* cited by examiner

*Primary Examiner* — Hoai V Ho
*Assistant Examiner* — Jay Radke
(74) *Attorney, Agent, or Firm* — Oblon, Spivak, McClelland, Maier & Neustadt, L.L.P.

(57) ABSTRACT

A semiconductor memory device comprises: a semiconductor substrate; a memory cell array provided above the semiconductor substrate and including a plurality of memory cells that are stacked; a plurality of bit lines connected electrically to the plurality of memory cells; and a plurality of sense amplifiers connected to the bit lines via bit line connection lines. The bit line connection lines have every adjacent N lines (where N is an integer of 2 or more) as one group. The sense amplifiers are arranged in a number smaller than N in a first direction that the bit line connection lines extend. An M number of the sense amplifiers are arranged in a width of a P number of groups in a second direction intersecting the first direction. The M number being larger than the P number.

17 Claims, 16 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2011-132606, filed on Jun. 14, 2011, the entire contents of which are incorporated herein by reference.

FIELD

The embodiments described herein relate to a semiconductor memory device.

BACKGROUND

Description of the Related Art

In recent years, progress in microfabrication technology is leading to a reduction in design rule in semiconductor memory devices. In contrast, when for example memory cell structure is for example a pillar structure, the memory cell array itself attains a structure which is difficult to miniaturize simply by reduction of design rule on the semiconductor substrate, hence efficient circuit layout is desired.

DETAILED DESCRIPTION

A semiconductor memory device according to an embodiment comprises: a semiconductor substrate; a memory cell array provided on the semiconductor substrate and including a plurality of memory cells that are stacked; a plurality of bit lines arranged in parallel connected electrically to the plurality of memory cells; and a plurality of sense amplifiers connected to the bit lines via bit line connection lines, the bit line connection lines having every adjacent N lines (where N is an integer of 2 or more) configuring one group, and the sense amplifiers being arranged in a number smaller than N in a first direction that the bit line connection lines extend. An M number of the sense amplifiers being arranged in a width of a P number of groups in a second direction intersecting the first direction, the M number being larger than the P number.

A semiconductor memory device according to embodiments are described below with reference to the drawings.

First Embodiment

Overall Configuration

Figure 1:
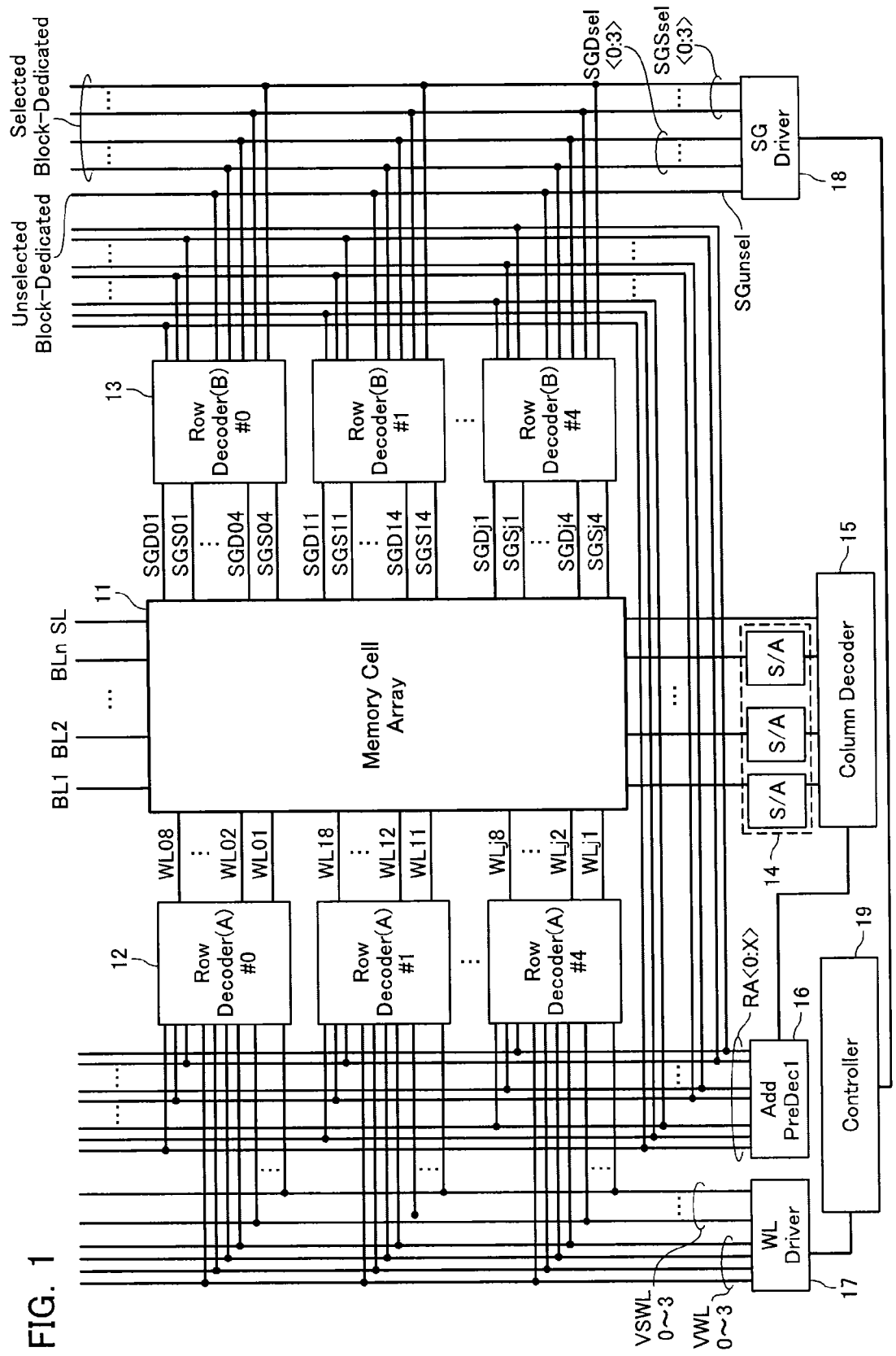
FIG. 1 is a block diagram showing a configuration of a semiconductor memory device according to a first embodiment.

First, an overall configuration of a semiconductor memory device according to a first embodiment is described with reference to FIG. 1. FIG. 1 is a block diagram showing the configuration of the semiconductor memory device according to the first embodiment.

Figure 2:
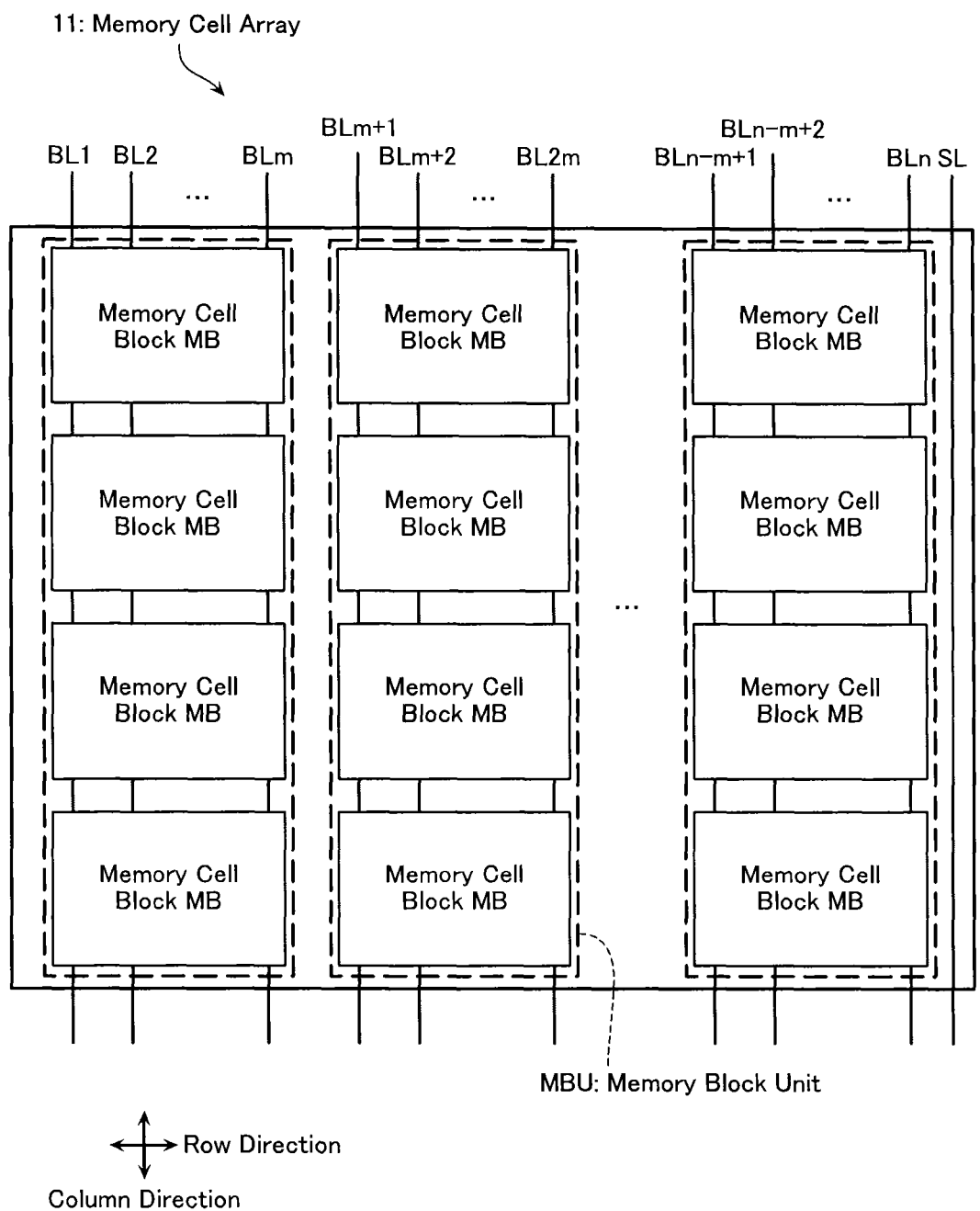
FIG. 2 is a schematic view showing a configuration of a memory cell array in the semiconductor memory device according to the same embodiment.

As shown in FIG. 1, the semiconductor memory device according to the first embodiment includes a memory cell array 11. As shown in FIG. 2, the memory cell array 11 includes a plurality of memory block units MBU arranged in a row direction, and each of the memory block units MBU comprises a plurality of memory cell blocks MB. The plurality of memory cell blocks MB included in the memory block unit MBU are arranged in a column direction (direction in which bit lines BL extend). All the memory cell blocks MB in the memory block unit MBU share the bit lines BL. In addition, a source line SL is commonly connected for all the memory block units MBU. The plurality of memory cell blocks MB are connected to a plurality of word lines WL and a plurality of select gate lines SGD and SGS extending in the row direction. The word lines WL are connected to a row decoder 12. The select gate lines SGD and SGS are connected to a row decoder 13. In addition, the bit lines BL are connected to a column decoder 15 via a sense amplifier 14.

The row decoder 12 selects the word lines WL based on a row address outputted from an address pre-decoder 16, and applies a voltage generated by a word line driver 17 to a selected word line WL and an unselected word line WL, respectively.

The row decoder 13 selects a source side select gate line SGS and a drain side select gate line SGD corresponding to an activated memory cell unit MU (FIG. 3) based on a row address outputted from the address pre-decoder 16. The row decoder 13 applies a gate voltage generated by a select gate line driver 18 to the selected source side select gate line SGS and drain side select gate line SGD.

The column decoder 15 decodes a column address signal outputted from the address pre-decoder 16 to perform input/output control of data. The sense amplifier 14 senses data of the bit line BL selected by the column decoder 15 and latches this data. A controller 19 receives a signal for executing read/write/erase operations and so on from an address command register not shown, and controls an internal voltage generating circuit not shown for generating various kinds of voltages required for core operation according to a certain sequence. Note that peripheral circuits of the row decoders 12 and 13, the sense amplifier 14, the column decoder 15, and so on, may be formed directly below the memory cell array 11.

[Memory Cell Array]

Figure 3:
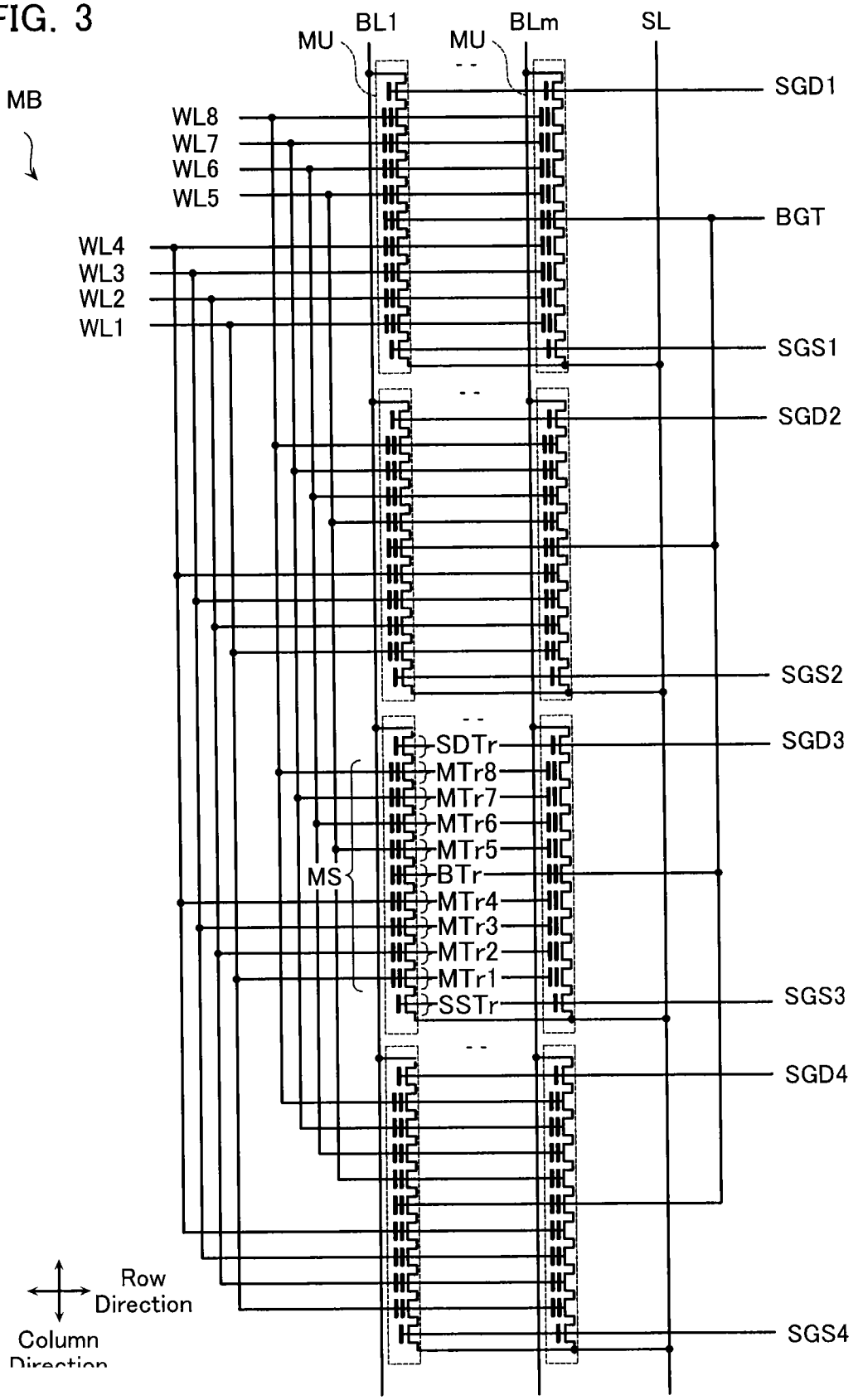
FIG. 3 is a circuit diagram of a part of the memory cell array in the semiconductor memory device according to the same embodiment.

Next, a configuration of the memory cell array 11 is described with reference to FIGS. 3-5. FIG. 3 is a circuit diagram showing a part of one memory cell block MB in the memory cell array 11.

As shown in FIG. 3, the memory cell block MB includes a plurality of memory units MU arranged in a matrix. One end of the memory unit MU is connected to the bit line BL and the other end is commonly connected to the source line SL.

The memory unit MU includes a memory string MS and a source side select transistor SSTr and drain side select transistor SDTr provided at the two ends of the memory string MS. The memory string MS herein includes a plurality of memory transistors MTr1-MTr8 connected in series and a back gate transistor BTr connected between the memory transistors MTr4 and MTr5.

The memory transistors MTr1-MTr8 have a MONOS structure including: a charge storage layer (for example, an insulating film) formed on, for example, a side surface of a semiconductor body via a gate insulating film; an insulating film (an insulating film of higher permittivity than the charge storage layer) formed on a side surface of the charge storage layer; and a control gate formed on a side surface of this insulating film. The memory transistors MTr1-MTr8 have their threshold voltages changed by storing a charge in this charge storage layer. As a result, the memory transistors MTr1-MTr8 store information corresponding to their respective threshold voltages.

Gates of the memory transistors MTrj arranged in the row direction in the memory cell block MB are commonly connected to the word line WLj extending in the row direction. In addition, the word lines WLj connected to the corresponding memory transistors MTrj in each of the memory units MU in one memory cell block MB are commonly connected. Moreover, a gate of the back gate transistor BTr in the memory unit MU is commonly connected to the back gate BGT.

Gates of each of the drain side select transistors SDTr arranged in the row direction in the memory cell block MB are commonly connected to the drain side select gate line SGD extending in the row direction. In addition, gates of each of the source side select transistors SSTr arranged in a line in the row direction in the memory cell block MB are commonly connected to the source side select gate line SGS extending in the row direction.

Next, a structure of the memory cell array 11 in accordance with the first embodiment is described with reference to FIG. 4.

Figure 4:
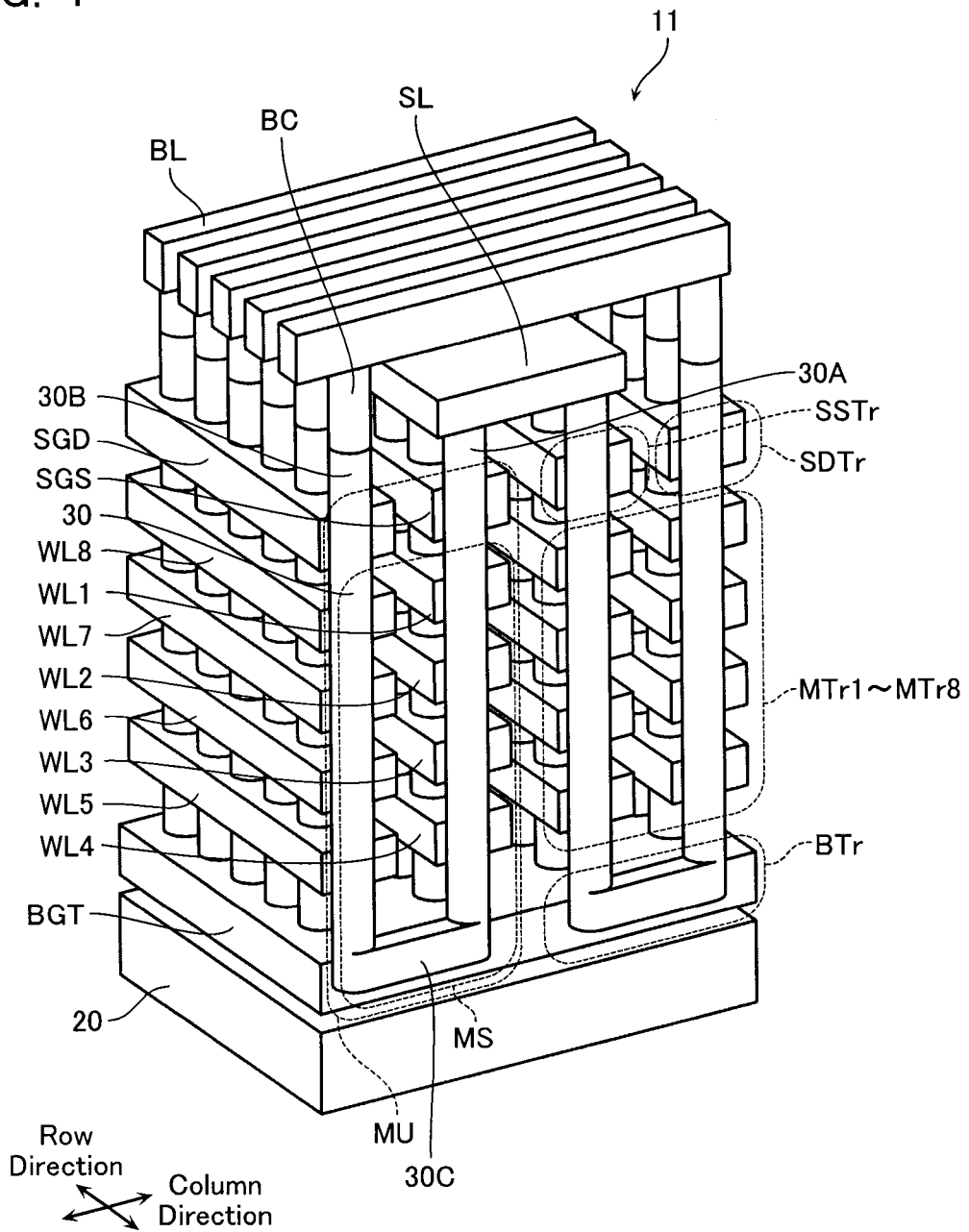
FIG. 4 is a perspective view of a part of the memory cell array in the semiconductor memory device according to the same embodiment.
Figure 5:
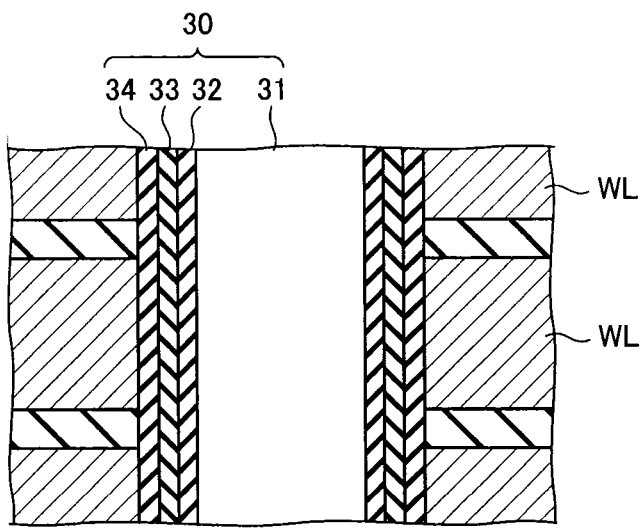
FIG. 5 is a cross-sectional view of a part of the memory cell array in the semiconductor memory device according to the same embodiment.

FIG. 4 is a perspective view showing a configuration of a part of the memory cell array 11.

As shown in FIG. 4, the memory cell array 11 comprises a U-shaped columnar semiconductor layer 30 on a semiconductor substrate 20, the semiconductor layer 30 having the two ends (source end and drain end) of the back gate transistor BTr extending upwardly in a vertical direction. A plurality of the semiconductor layers 30 are arranged in a matrix in the column direction and in the row direction. The semiconductor layer 30, as shown by enlarging part of its cross-section in FIG. 5, is configured by a columnar semiconductor body 31, and a tunnel insulating layer 32, a charge storage layer 33, and a block insulating layer 34 covering a side surface of the semiconductor body 31. That is, the tunnel insulating layer 32 surrounds the semiconductor body 31, the charge storage layer 33 surrounds the tunnel insulating layer 32, and the block insulating layer 34 surrounds the charge storage layer 33. In addition, the word line WL further surrounds the block insulating layer 34. Employable as the tunnel insulating layer 32 and the block insulating layer 34 is, for example, silicon oxide ($SiO_2$) or the like. Employable as the charge storage layer 33 is, for example, silicon nitride (SiN) or the like.

The back gate BGT is disposed on the semiconductor substrate 20. The back gate transistor BTr is formed by this back gate BGT and a folded part of the semiconductor layer 30. The folded part herein is described using FIG. 4. The semiconductor layer 30 includes a first columnar portion 30A, a second columnar portion 30B, and a folded portion 30C. The folded part refers to this 30C in FIG. 4.

Stacked in a periphery of one of the columnar semiconductor layers 30A, upwardly in a vertical direction from a semiconductor substrate 20 side, via insulating layers, in the following described order, are conductive layers forming the word lines WL4, WL3, WL2, and WL1, and the source side select gate line SGS. These conductive layers are connected to a side surface of the semiconductor layer 30. In addition, stacked in a periphery of the other of the columnar semiconductor layers 30B, upwardly in a vertical direction from a semiconductor substrate 20 side, via insulating layers, in the following described order, are conductive layers forming the word lines WL5, WL6, WL7, and WL8, and the drain side select gate line SGD. These conductive layers are connected to a side surface of the semiconductor layer 30. As a result, the memory transistors MTr1-MTr8 are formed having the word lines WL1-WL8 as control gates, and the U-shaped semiconductor body 31 as a channel body. Moreover, the source side select transistor SSTr, the drain side select transistor SDTr, and the back gate transistor BTr are configured having the source side select gate line SGS, the drain side select gate line SGD, and the back gate BGT, respectively, as gates, and the U-shaped semiconductor layer 30 as a body.

That is, the memory transistors MTr1-MTr8 and the back gate transistor BTr configure the memory string MS having a stacking direction as a long direction. In addition, the memory string MS, the drain side select transistor SDTr, and the source side select transistor SSTr configure the memory unit MU. The memory unit MU has its source side, that is, one end portion of the semiconductor layer 30, connected to the source line SL. The memory cell unit MU has its drain side, that is, the other end portion of the semiconductor layer 30, connected to the bit line BL via a bit line contact BC.

[Sense Amplifiers]

Next, a layout of the sense amplifiers 14 in the semiconductor memory device according to the present embodiment is described while contrasting with a comparative example.

Figure 6:
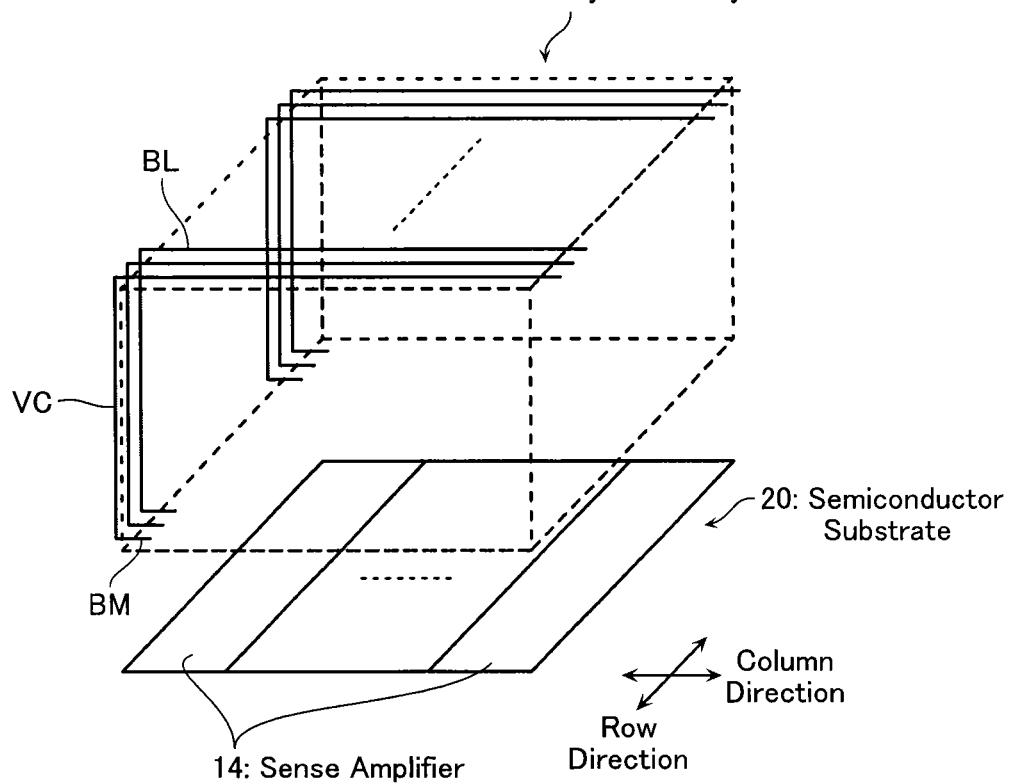
FIG. 6 is a perspective view showing a layout of sense amplifiers in the semiconductor memory device according to the same embodiment.

As shown in for example FIG. 6, the sense amplifier 14 can be formed in the semiconductor substrate 20 directly below the memory cell array 11. The bit line BL and a bit line connection line BM formed in the sense amplifier 14 are connected by, for example, a vertical via contact VC. Note that the sense amplifier 14 need not be disposed directly below the memory cell array 11 and may be disposed outside a near proximity to a side surface of the memory cell array 11.

Next, a layout example of the sense amplifiers 14 in the semiconductor memory device of the present embodiment is described by comparing with a comparative example.

Figure 7:
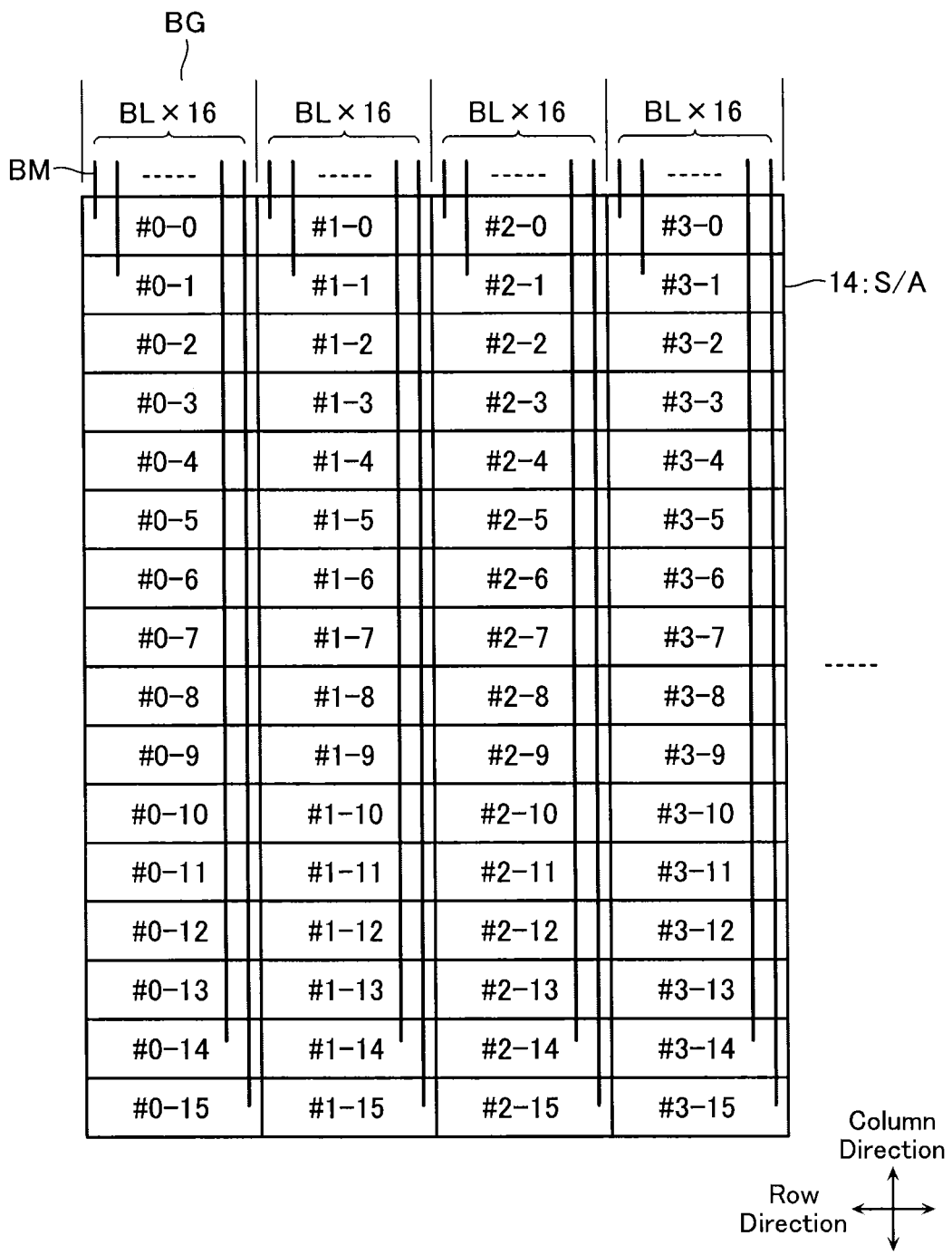
FIG. 7 is a plan view showing a layout of sense amplifiers in a semiconductor memory device according to a comparative example.

FIG. 7 is a plan view showing a layout example of the sense amplifiers 14 according to a comparative example.

The bit line connection line BM connected to each of the bit lines BL extends in a column direction (first direction) to be respectively connected to one sense amplifier 14. A width in a row direction (second direction) of the sense amplifier 14 is broader than a pitch in the row direction of the bit line connection lines BM. Therefore, N (in this example, N=16) bit line connection lines configure one bit line group BG, and N sense amplifiers 14 are aligned in the column direction. The N bit line connection lines BM aligned in the row direction are extended sequentially in the column direction as far as the sense amplifier 14 to which they are to be respectively connected and are connected to that sense amplifier 14.

In the comparative example, an arrangement number N (=16) in the column direction of the sense amplifiers 14 is equal to the number N (=16) of the bit line connection lines BM configuring the bit line group BG. An arrangement pitch in the row direction of the bit line connection lines BM herein is determined by a pitch in the row direction of the bit lines BL, that is, the pillar-shaped semiconductor layer 30. Therefore, when the pitch determined by the design rule of the sense amplifier 14 is small compared to the pitch of the semiconductor layer 30, a waste of space is generated as a result in the layout of the sense amplifier in the comparative example.

Figure 8:
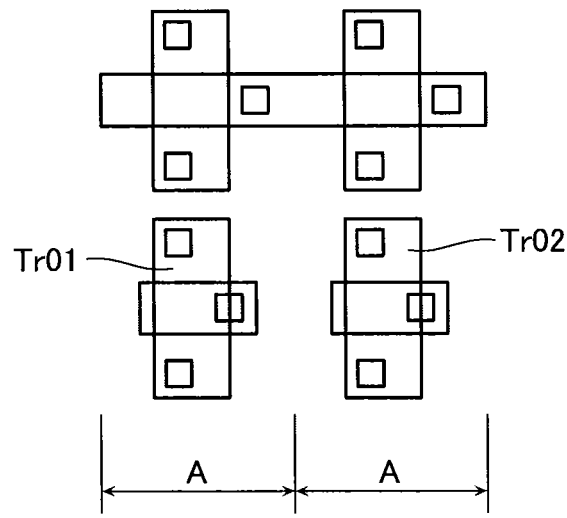
FIG. 8 is a plan view showing a layout of circuit elements in the sense amplifiers in the semiconductor memory device according to the same comparative example.
Figure 9:
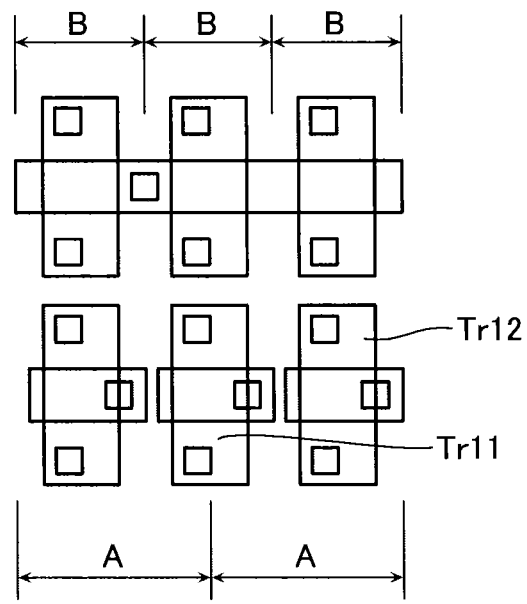
FIG. 9 is a plan view showing a layout of circuit elements in the sense amplifiers in the semiconductor memory device according to the first embodiment.

Accordingly, in this embodiment, a pitch A of transistors Tr in the sense amplifier 14 as shown in for example FIG. 8 is reduced to a pitch B which is two-thirds (⅔) of the pitch A as shown in FIG. 9. The pitch A is a distance between edges of diffusion layers of transistors Tr01 and Tr02 in FIG. 8, and the pitch B is a distance between edges of diffusion layers of transistors Tr11 and Tr12. Note that the bit line groups BM are respectively arranged in the row direction with the pitch A.

Figure 10:
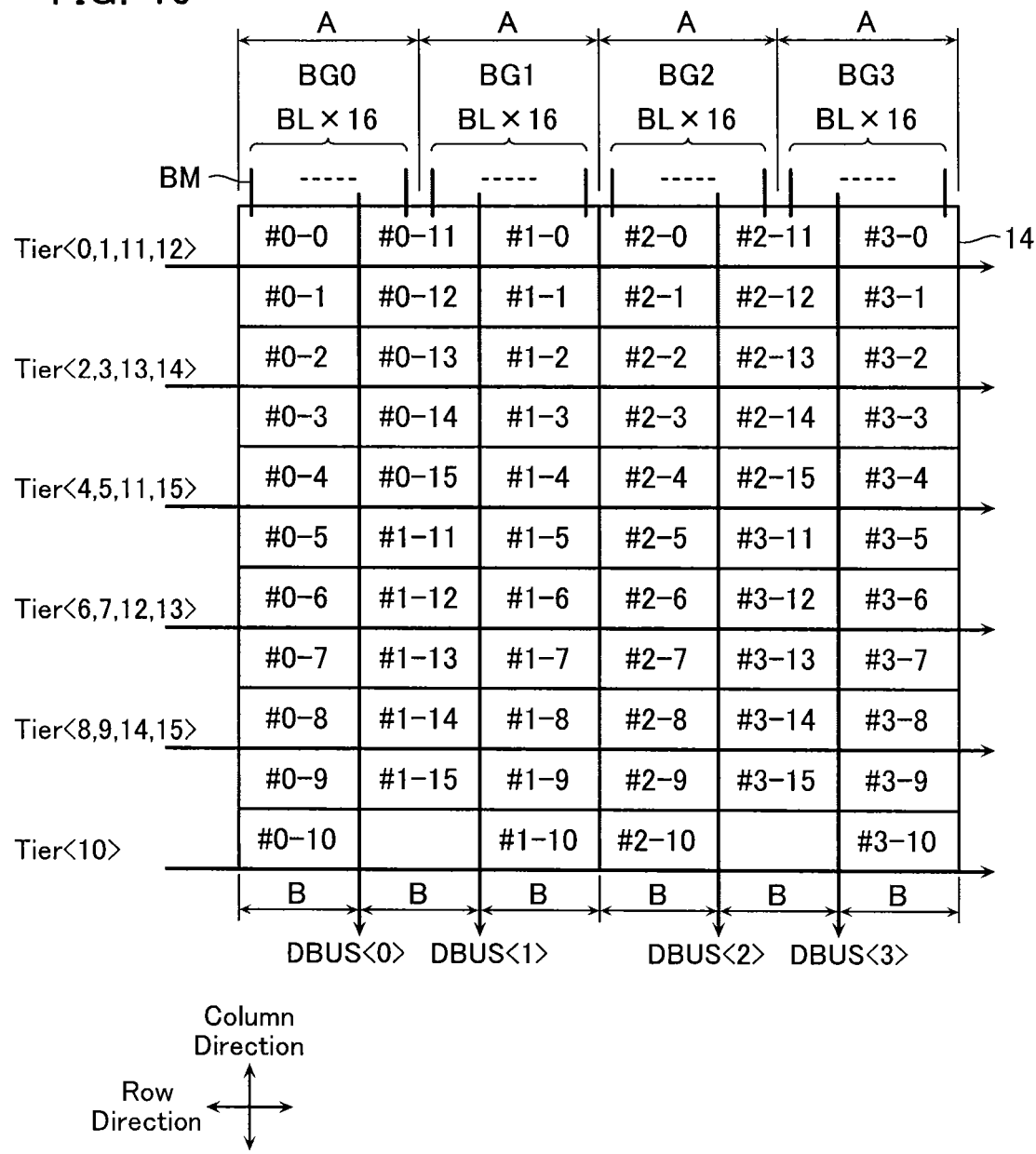
FIG. 10 is a plan view showing a layout of the sense amplifiers in the semiconductor memory device according to the same embodiment.

FIG. 10 shows a layout of the sense amplifiers 14 in the semiconductor memory device according to the present embodiment in which the pitch of the transistors has been reduced to the pitch B which is two-thirds (⅔) of the pitch A in this way. Therefore, an M number of the sense amplifiers 14 being arranged in a width of a P number of groups in the second direction. Here, the M number being larger than the P number.

That is, in the present embodiment, the pitch in the row direction of the sense amplifiers 14 is set to the pitch B which is two-thirds (⅔) of the pitch A of the bit line groups BG, whereby three columns of the sense amplifiers 14 correspond to two of the bit line groups BG. Moreover, if the pitch in the first direction that the bit line connection lines BM extend on the sense amplifiers 14 is assumed to be M, a length on the sense amplifiers 14 of the bit line connection lines BM is smaller than N×M. A number "#i-j" allocated to each of the sense amplifiers 14 herein indicates that a particular sense amplifier 14 is connected to the j-th bit line connection line BMj of the i-th bit line group BGi.

In this layout example, eleven sense amplifiers (#0-0 to #0-10) are arranged in the first column from the left, ten sense amplifiers (#0-11 to #0-15 and #1-11 to #1-15) are arranged in the second column from the left, and eleven sense amplifiers (#1-0 to #1-10) are arranged in the third column from the left in FIG. 10. The fourth and higher-numbered columns from the left in FIG. 10 also have a similar arrangement.

A control signal line Tier<j> is positioned between the sense amplifiers 14 adjacent in the column direction and is commonly connected to the sense amplifiers 14 (#i-j (i=0, 1, 2, 3, ... )). This control signal line Tier<j> is a signal line for activating the sense amplifier 14 and extends in the row direction. In addition, an output signal line DBUS<i> is positioned between the sense amplifiers 14 adjacent in the row direction. This output signal line DBUS<i> has a function of transferring read data to an output buffer not shown.

Figure 11:
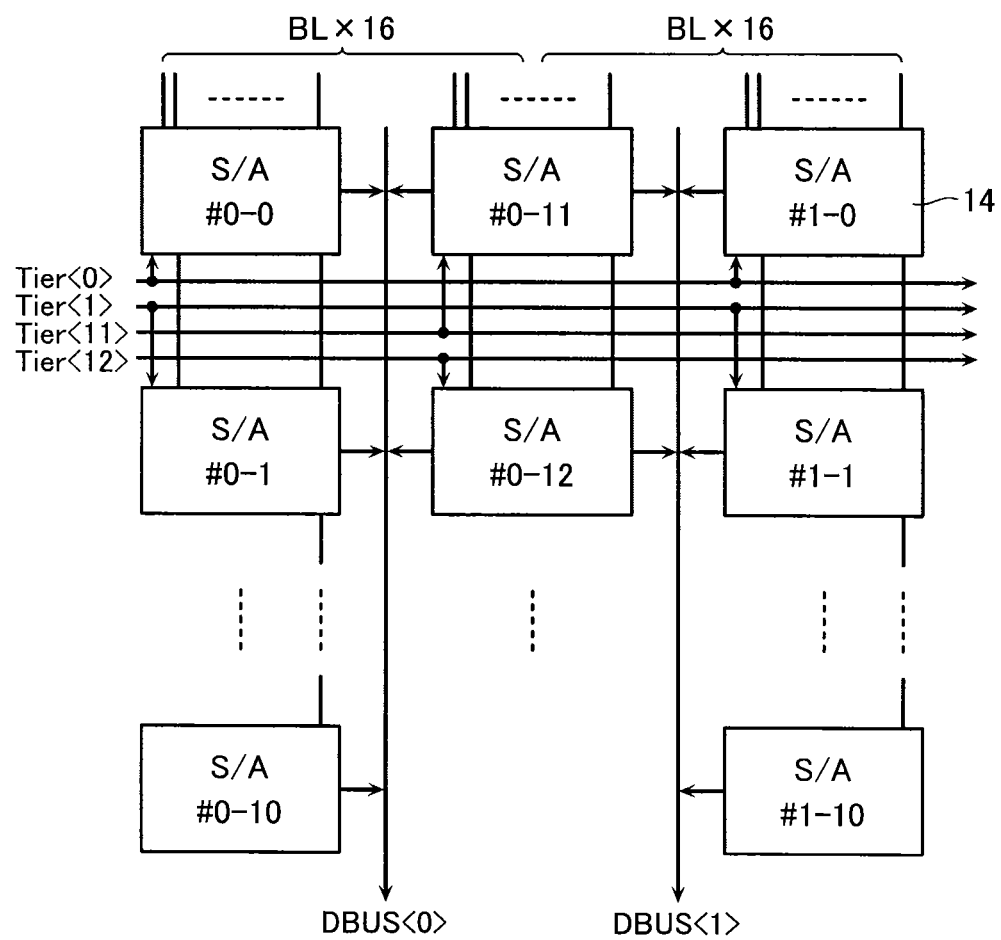
FIG. 11 is a circuit diagram showing part of FIG. 10 in detail.

FIG. 11 is a circuit diagram showing a relationship between the control signal line Tier<j>, the output signal line DBUS<i>, and each of the sense amplifiers 14. The control signal line Tier<j> transfers a control signal for simultaneously activating the sense amplifiers (#i-j). In addition, the output signal line DBUS<i> is connected to an output of the sense amplifiers (#i-j (j=1 to 16)). As a result, activation of the control signal line Tier<j> causes data outputted from the sense amplifier (#i-j) to be outputted via the output signal line DBUS<i>.

As shown in FIG. 10, in this example, regarding the sense amplifiers 14 aligned in the column direction, the first from the top are #0-0, #0-11, #1-0, #2-0, #2-11, #3-0, ... , the second from the top are #0-1, #0-12, #1-1, #2-1, #2-12, #3-1, ... , and so on. Therefore, as shown in FIG. 11, four control signal lines Tier<0>, Tier<1>, Tier<11>, and Tier<12> are positioned between the first and second from the top.

The present embodiment allows the number of sense amplifiers 14 in the column direction to be reduced from sixteen to eleven, and a length in the column direction to be reduced by about 31 percent. Therefore, the present embodiment makes it possible to efficiently utilize dead space and reduce an area occupied by the sense amplifier 14. Moreover, the length of the bit line connection lines BM is reduced, hence parasitic capacitance is suppressed and an improvement in operation speed is also expected.

Second Embodiment

Next, a semiconductor memory device according to a second embodiment is described with reference to FIG. 12. The semiconductor memory device according to the present embodiment is basically similar to that of the first embodiment, but differs in layout of the sense amplifier 14.

Figure 12:
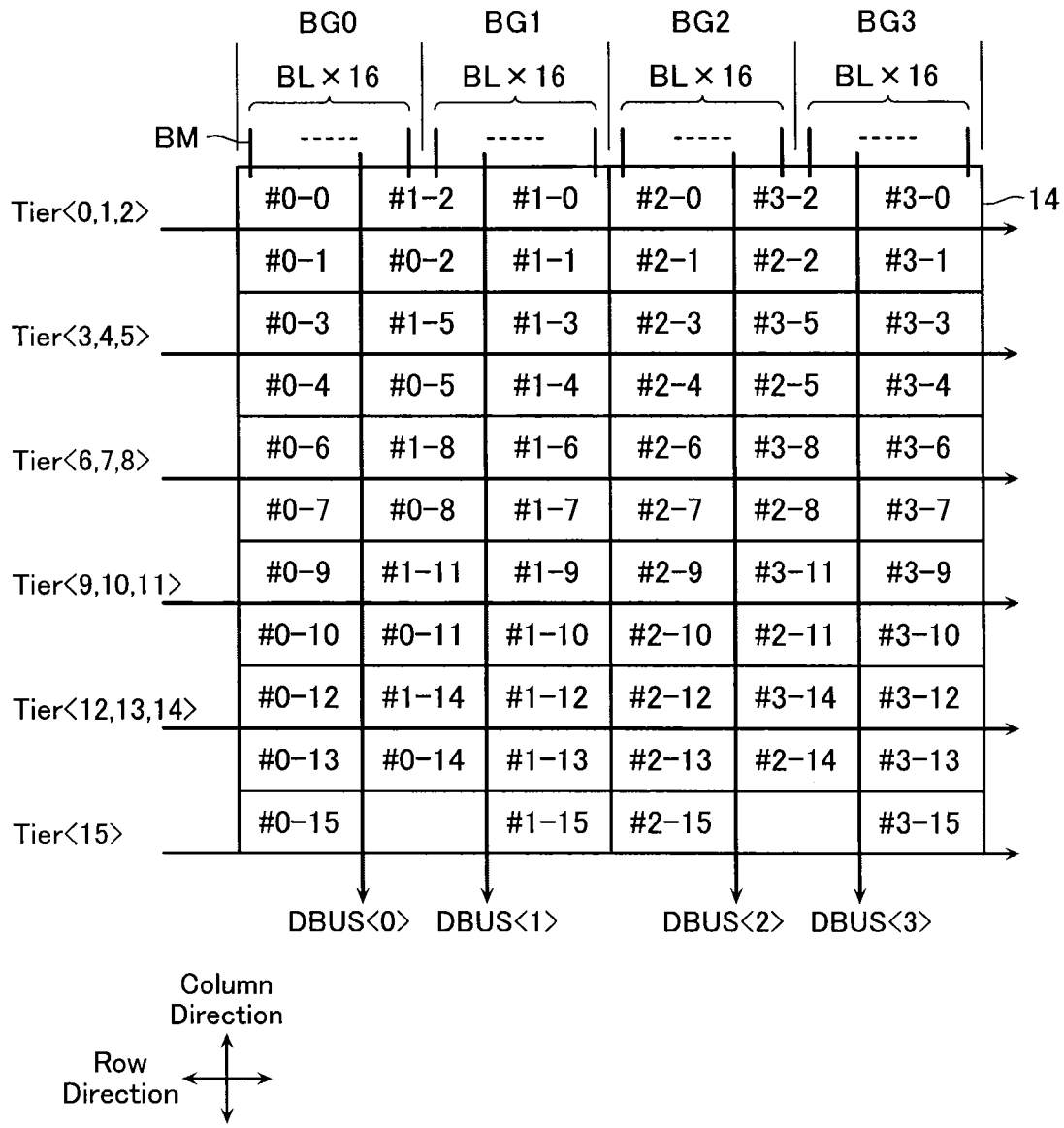
FIG. 12 is a plan view showing a layout of sense amplifiers in a semiconductor memory device according to a second embodiment.

As shown in FIG. 12, in the second embodiment, the sense amplifiers 14 in a first column from the left of sense amplifiers 14 arranged in the column direction is arranged in the manner of #0-0, #0-1, #0-3, #0-4, #0-6, #0-7, ... , #0-10, leaving out every third sense amplifier (#0-2, #0-5, #0-8, #0-11, and #0-14). The left out sense amplifiers 14 are arranged alternately in the second column from the left of sense amplifiers 14. A similar arrangement to that of the first column from the left of sense amplifiers 14 is adopted also in the third column from the left of sense amplifiers 14. The sense amplifiers left out from the third column (#1-2, #1-5, #1-8, #1-11, and #1-14) are arranged in the second column alternately with the sense amplifiers 14 left out from the first column. This results in the first from the top of the sense amplifiers 14 being arranged in the column direction in the manner of #0-0, #1-2,

1-0, #2-0, #3-2, #3-0, . . . , the second from the top of the sense amplifiers 14 being arranged in the column direction in the manner of #0-1, #0-2, #1-1, #2-1, #2-2, #3-1, . . . , and so on.

As a result of the second embodiment, the sense amplifiers 14 that are in the second column from the left of sense amplifiers 14 and that are arranged at both sides of the first control signal line Tier from the top are both connected to the second (#i−2) bit line connection line BM. In other words, the first row of sense amplifiers 14 and the second row of sense amplifiers 14 in the row direction are connected to any of the zero, first, and second bit line connection lines BM. As a result, it is sufficient to wire three control signal lines Tier<0>, Tier<1>, and Tier<2> between the first from the top and second from the top sense amplifiers 14, and a reduction of one control signal line can be made with respect to the four control signal lines between the sense amplifiers 14 in the first embodiment. Hence, the present embodiment, in addition to the advantages of the first embodiment, allows the number of control signal lines to be reduced from 21 to 16 overall and makes possible a further reduction in area of the sense amplifier 14.

Third Embodiment

Next, a semiconductor memory device according to a third embodiment is described with reference to FIG. 13. Regarding the semiconductor memory device according to the present embodiment, when three columns of the sense amplifiers 14 are assumed to be a unit, the layout of the left column of sense amplifiers 14 is the same as in the second embodiment, but the layout of the other sense amplifiers 14 differs from that in the second embodiment.

Figure 13:
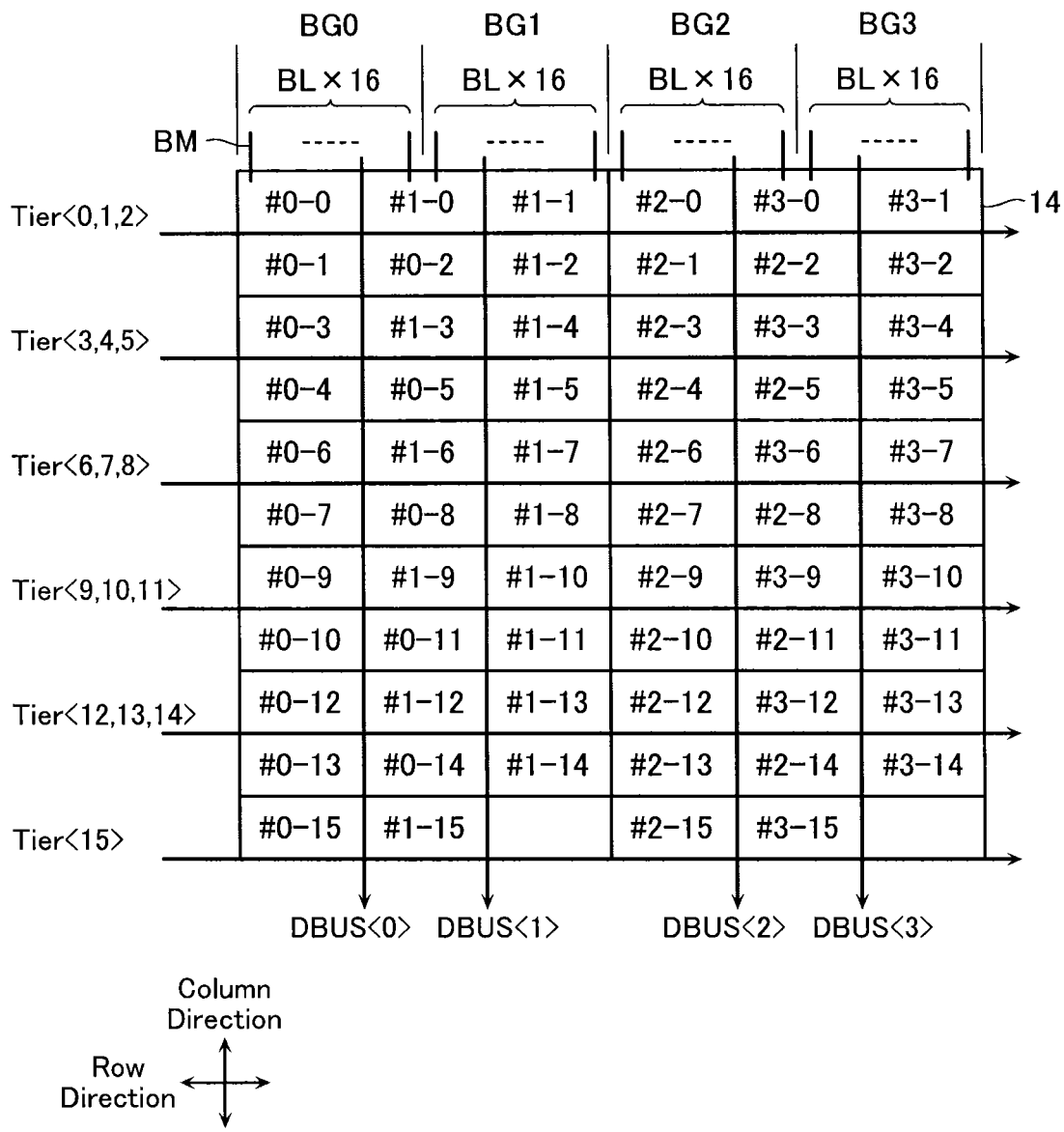
FIG. 13 is a plan view showing a layout of sense amplifiers in a semiconductor memory device according to a third embodiment.

As shown in FIG. 13, in the present embodiment, the third column from the left of sense amplifiers 14 in the column direction is formed in the manner of #1-1, #1-2, #1-4, #1-5, #1-7, #1-8, . . . , #1-14, leaving out every third sense amplifier (#1-0, #1-3, #1-6, #1-9, #1-12, and #1-15). These left out sense amplifiers 14 are arranged alternately in the second column from the left of sense amplifiers 14.

In this embodiment, there are eleven sense amplifiers 14 in the first and second columns from the left of sense amplifiers 14, and ten sense amplifiers 14 in the third column from the left of sense amplifiers 14. In this embodiment also, odd-numbered sense amplifiers 14 and even-numbered sense amplifiers 14 adjacent in the column direction via the control signal lines Tier are only connected to three kinds of bit line connection lines BM, hence three control signal lines Tier disposed between the sense amplifiers 14 are sufficient. As a result, similar advantages to those in the first and second embodiments are displayed.

Fourth Embodiment

Next, a semiconductor memory device according to a fourth embodiment is described with reference to FIG. 14.

The fourth embodiment is a mirror pattern in which the layout pattern of the three-column unit of sense amplifiers 14 in the third embodiment is inverted for an even-numbered unit.

Figure 14:
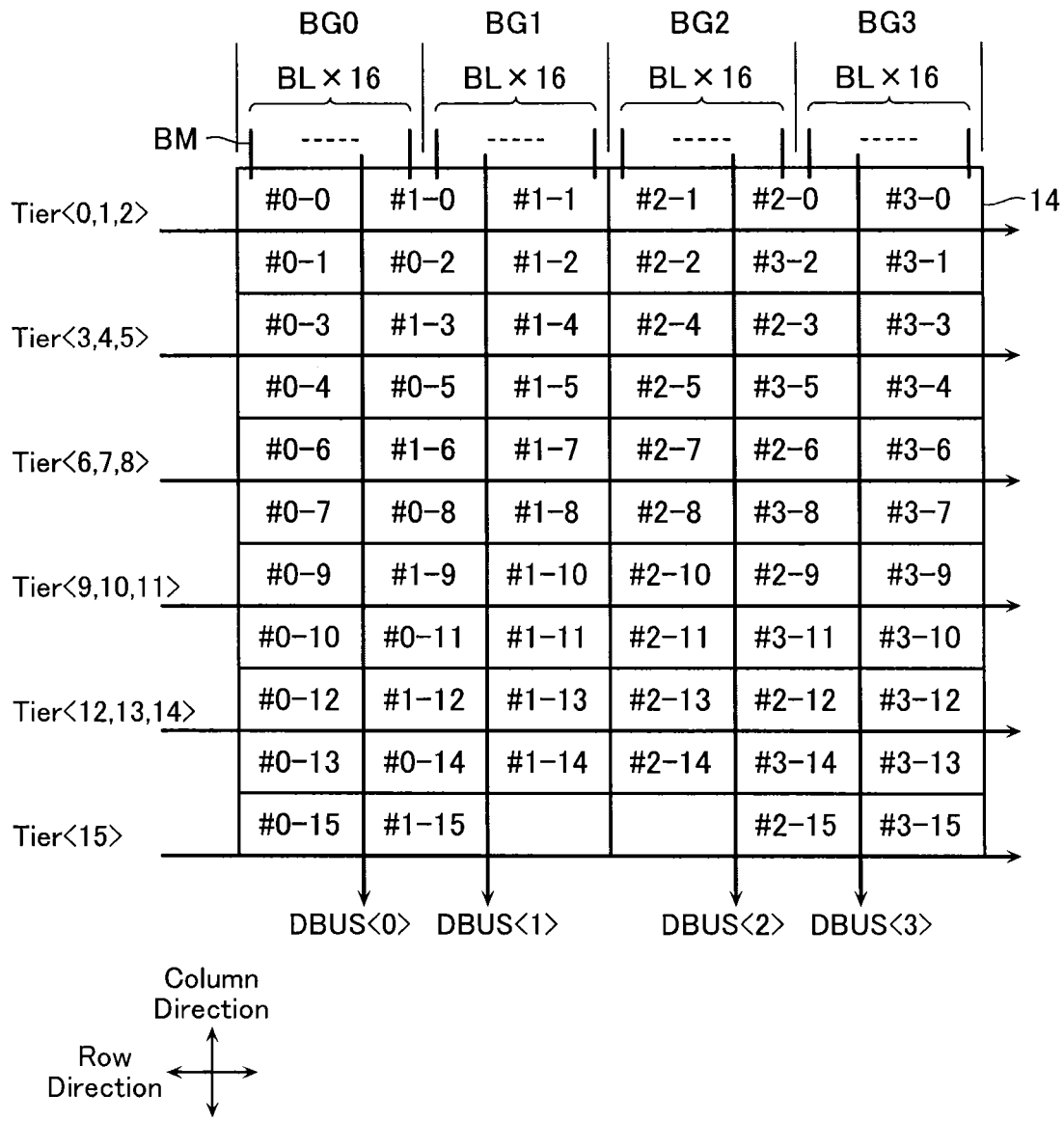
FIG. 14 is a plan view showing a layout of sense amplifiers in a semiconductor memory device according to a fourth embodiment.

Therefore, in FIG. 14, from the first column to the third column from the left is the same as in the third embodiment, but from the fourth column to the sixth column from the left is a pattern that mirror-reverses the layout of the sense amplifiers 14 in the third embodiment.

Figure 15:
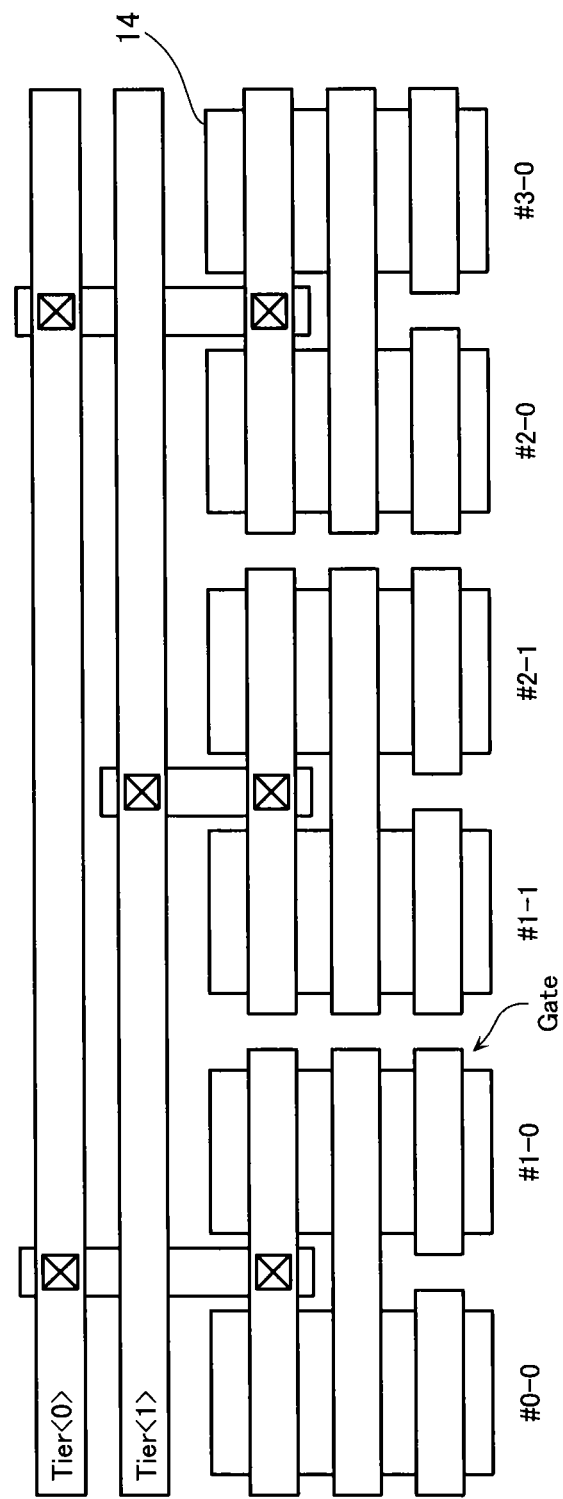
FIG. 15 is a plan view showing a method of wiring of the sense amplifiers in the semiconductor memory device according to the fourth embodiment.

The present embodiment results in, for example, the third column and fourth column sense amplifiers in the first row being #1-1 and #2-1, and the second column to fifth column sense amplifiers in the second row being #0-2, #1-2, #2-2, and #3-2. In this way, the present embodiment results in sense amplifiers 14 of different bit line groups BG connected to identical bit line connection lines BM being sequential in the row direction. Therefore, as shown in FIG. 15, sense amplifiers 14 to which common control signal lines Tier are connected become closely arranged, hence making it possible to increase sharing of contacts between adjacent sense amplifiers 14, thereby obtaining an advantage of even easier wiring of the control signal lines Tier. Moreover, such a configuration allows a reduction in wiring capacitance and a reduction in area exclusively occupied by contacts, and thus enables high speed operation.

Fifth Embodiment

Figure 16:
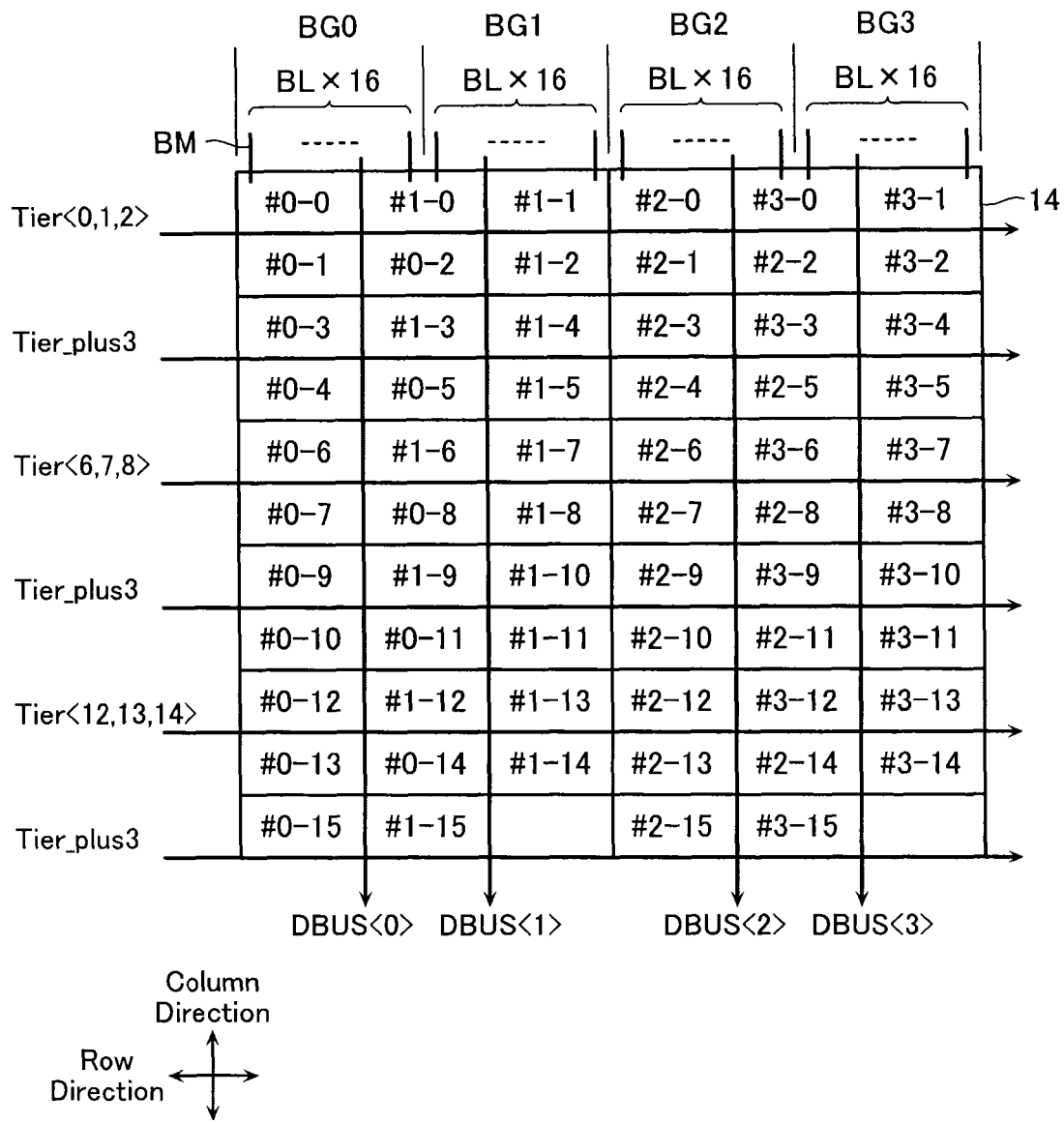
FIG. 16 is a plan view showing a layout of sense amplifiers in a semiconductor memory device according to a fifth embodiment.

Next, a semiconductor memory device according to a fifth embodiment is described with reference to FIGS. 16-18.

The present embodiment is similar to the third embodiment regarding layout of the sense amplifiers 14. As shown in FIG. 16, the control signal lines Tier<3, 4, 5>, Tier<9, 10, 11>, and Tier<15> in the third embodiment are omitted, and switching signal lines Tier_plus3 are positioned instead.

Figure 17:
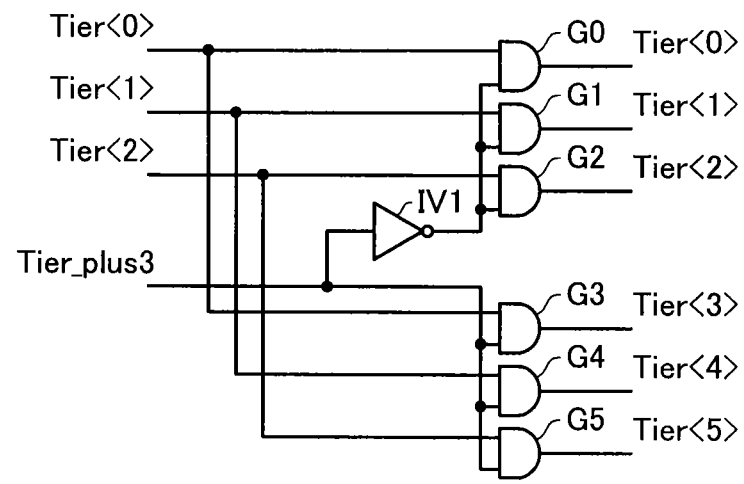
FIG. 17 is a circuit diagram showing an example of a decode circuit used in the same embodiment.

FIG. 17 is a circuit diagram showing a decode circuit for generating the control signal lines Tier<0, 1, 2> and Tier<3, 4, 5> by the control signal line Tier<0, 1, 2> and the switching signal line Tier_plus3. In this decode circuit, when the switching signal line Tier_plus3 is at "L" level, an output of the inverter IV1 becomes "H" level, gate circuits G0, G1, and G2 attain an on state, and the control signal lines Tier<0, 1, 2> are thereby selected. On the other hand, when the switching signal line Tier_plus3 is at "H" level, gate circuits G3, G4, and G5 attain an on state, and the control signal lines Tier<3, 4, 5> are thereby selected. This decode circuit is formed in any of the sense amplifiers 14.

Figure 18:
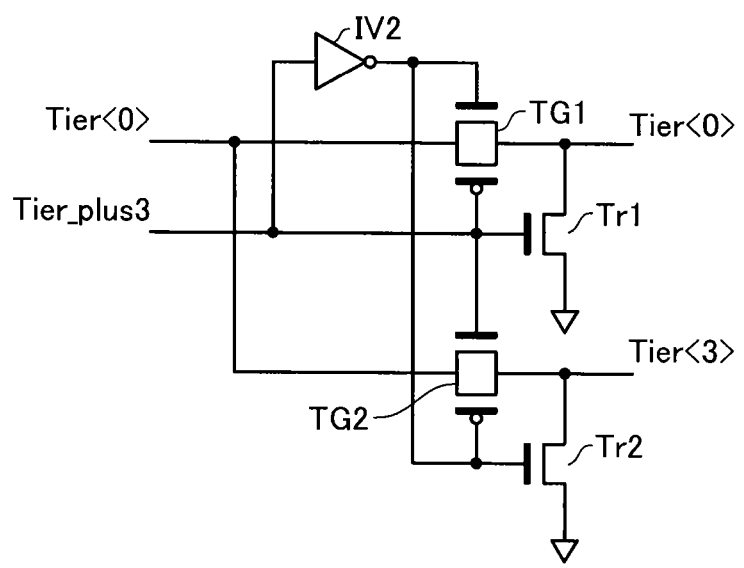
FIG. 18 is a circuit diagram showing another example of a decode circuit used in the same embodiment.

FIG. 18 is a circuit diagram showing another decode circuit. In this decode circuit, when the switching signal line Tier_plus3 is at "L" level, an output of the inverter IV2 becomes "H" level, a transfer gate TG1 is opened, and a signal of the control signal line Tier<0> is transferred to an output side. At this time, an output side of a transfer gate TG2 that remains closed is pulled down by a transistor Tr2 to prevent the output side of the transfer gate TG2 from attaining a floating state. When the switching signal line Tier_plus3 is at "H" level, the transfer gate TG1 closes, the transfer gate TG2 opens, and a signal of the control signal line Tier<3> is transferred to the output side. A transistor Tr1 pulls down the output side of the transfer gate TG1. The control signal lines Tier<1, 2, 4, 5>, although not shown in FIG. 18, are controlled similarly.

The present embodiment allows the number of control signal lines Tier to be reduced to twelve compared to sixteen in the second through fourth embodiments, thereby enabling a further reduction in area of the sense amplifier 14. Note that in the present embodiment, three switching signal lines Tier_plus3 are provided dispersed in the column direction, hence making laying of wiring easy, but if there are no problems with laying of wiring, there need only be one switching signal line Tier_plus3. As a result, reducing the number of switching signal lines Tier_plus3 enables a further reduction in area of the sense amplifier 14.

Sixth Embodiment

Figure 19:
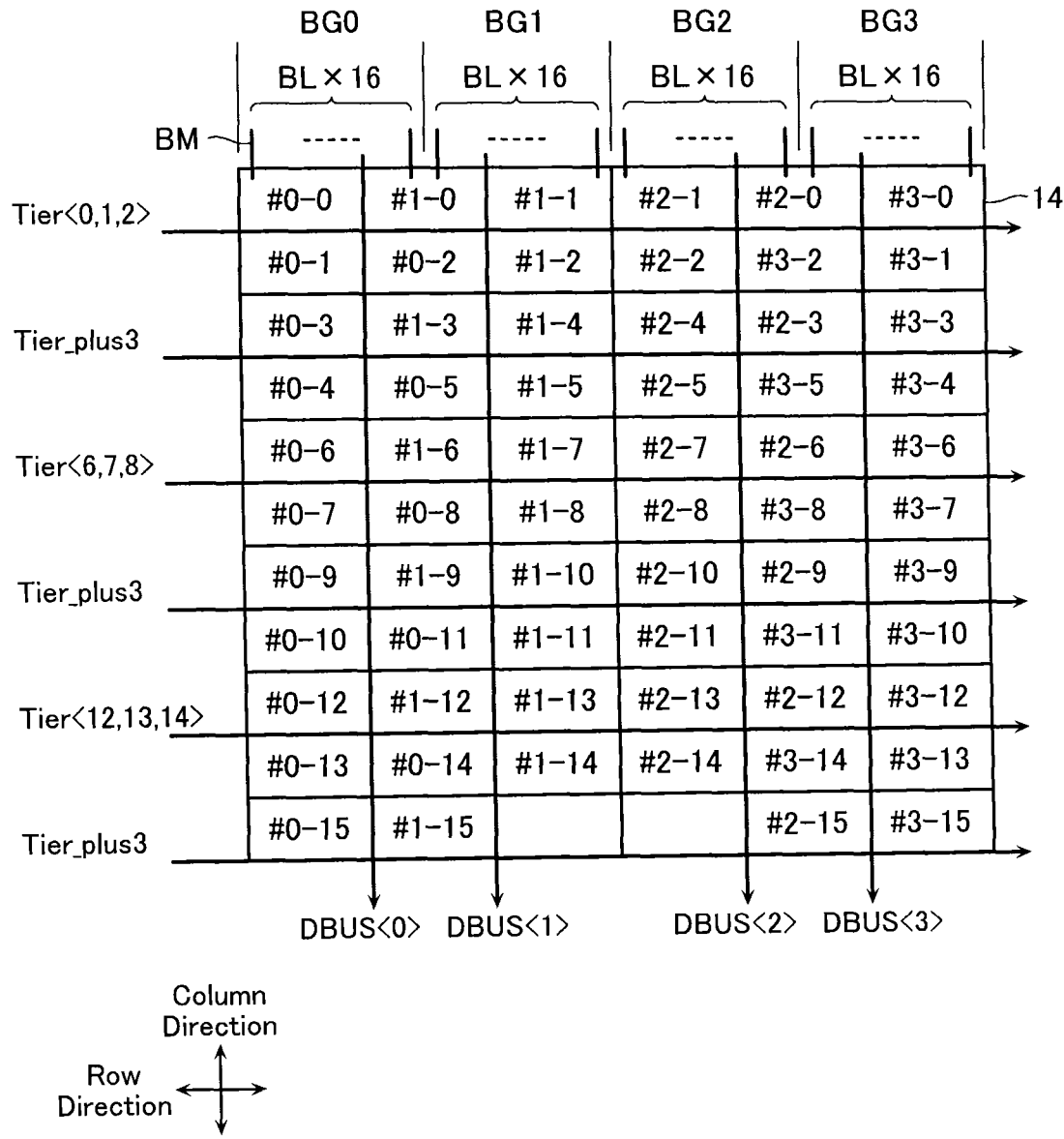
FIG. 19 is a plan view showing a layout of sense amplifiers in a semiconductor memory device according to a sixth embodiment.

FIG. 19 is a view showing a layout of the sense amplifiers 14 in a semiconductor memory device according to a sixth embodiment.

The present embodiment sets the layout of the sense amplifiers 14 in the fifth embodiment to be the same as the layout of the sense amplifiers 14 in the fourth embodiment shown in FIG. 14.

This embodiment displays similar advantages to those of the fourth and fifth embodiments.

Other Embodiments

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. For example, in the above-described embodiments, one bit line group BG is configured by sixteen bit line connection lines BM, and three columns of sense amplifiers 14 are corresponded to two bit line groups BG in the column direction. However, the present invention is not limited to this, and if one bit line group BG is configured by N (where N is an integer of 2 or more) adjacent bit line connection lines BM and the sense amplifiers 14 are arranged in a number smaller than N in the column direction and with a pitch smaller than an arrangement pitch of the bit line groups BG in the row direction, then any number and pitch are possible. However, it is desirable that three or more columns of sense amplifiers are formed in a width of two adjacent bit line groups. In addition, the above-described embodiments relate to a pipe-type semiconductor memory device, but the present invention may of course be applied also to a semiconductor memory device using a two-dimensionally arranged other form of memory cell array, in addition to an I-type semiconductor memory device using a pillar semiconductor as a channel body of the memory string MS. Naturally, the circuit configurations and so on shown in the present embodiments may also be changed appropriately. The accompanying claims and their equivalents are intended to cover such forms or modifications as would fall within the scope and spirit of the inventions.

What is claimed is:

1. A semiconductor memory device, comprising:
a semiconductor substrate;
a memory cell array provided above the semiconductor substrate and including a plurality of memory cells that are stacked in a vertical direction extending away from the substrate;
a plurality of bit lines connected electrically to the plurality of memory cells; and
a plurality of sense amplifiers, wherein
each sense amplifier is connected to a respective bit line via a respective bit line connection line,
the bit line connection lines having every adjacent N lines (where N is an integer of 2 or more) as one group,
the sense amplifiers being arranged in a number smaller than N in a first direction that the bit line connection lines extend,
an M number (M is an integer of 1 or more) of the sense amplifiers being arranged in a width of a P number (P is an integer of 1 or more) of groups in a second direction intersecting the first direction,
each group of sense amplifiers corresponding to a respective group of bit line connection lines, the M number being larger than the P number, and
the memory cell array comprises a column of the sense amplifiers extending in the first direction, wherein the column includes sense amplifiers connected to bit line connection lines belonging to two adjacent groups.

2. The semiconductor memory device according to claim 1, wherein
the sense amplifiers are arranged in the second direction with a pitch that is two-thirds (⅔) of an arrangement pitch of the groups,
a first, a second, and a third sense amplifier columns are arranged corresponding to a first group and a second group that are adjacent to one another,
the bit line connection lines included in the first group are connected to the sense amplifiers included in the first sense amplifier column and are connected to half of the sense amplifiers among the sense amplifiers included in the second sense amplifier column, and
the bit line connection lines included in the second group are connected to the remaining half of the sense amplifiers among the sense amplifiers included in the second sense amplifier column and are connected to the sense amplifiers included in the third sense amplifier column.

3. The semiconductor memory device according to claim 1, wherein
the sense amplifiers arranged in the second direction are connected to the bit line connection lines connected to two corresponding positions in each of the groups,
and the device further comprises:
a control signal line extending in the second direction commonly connected to the sense amplifiers connected to the bit line connection lines at the corresponding positions in each of the groups; and
an output signal line extending in the first direction for transferring data read from the sense amplifiers.

4. The semiconductor memory device according to claim 3, wherein
the control signal line is positioned between the sense amplifiers adjacent in the first direction, and
one bit line connection line to which one of the sense amplifiers adjacent in the first direction is connected and another bit line connection line to which the other of the sense amplifiers adjacent in the first direction is connected are set in the same position within the different groups.

5. The semiconductor memory device according to claim 4, further comprising:
a plurality of control signal lines connected to different sense amplifiers in the first direction respectively; and
a switching signal line for switching the control signal lines.

6. The semiconductor memory device according to claim 3, wherein
the sense amplifiers connected to the bit line connection lines at corresponding positions in different groups are disposed adjacently in the second direction, and
two of the sense amplifiers connected to the bit line connection lines at corresponding positions in different groups and disposed adjacently in the second direction are connected to the control signal line via a common contact.

7. A semiconductor memory device, comprising:
a semiconductor substrate;
a memory cell array provided above the semiconductor substrate and including a plurality of memory cells that are stacked in a vertical direction extending away from the substrate;
a plurality of bit lines connected electrically to the plurality of memory cells; and a plurality of sense amplifiers, wherein
each sense amplifier is connected to a respective bit line via a respective bit line connection line,
the bit line connection lines having every adjacent N lines (where N is an integer of 2 or more) as one group,
each group of bit line connection lines corresponding to a respective group of sense amplifiers,
when a first direction is a direction that the bit line connection lines extend and a pitch of the sense amplifiers in the first direction is assumed to be O, sum of lengths of the sense amplifiers arranged in the first direction being smaller than N×O, and
the memory cell array comprises a column of the sense amplifiers extending in the first direction, wherein the column includes sense amplifiers connected to bit line connection lines belonging to two adjacent groups.

8. The semiconductor memory device according to claim 7, wherein
the sense amplifiers are arranged in a second direction intersecting the first direction with a pitch that is two-thirds (⅔) of an arrangement pitch of the groups,
a first, a second, and a third sense amplifier columns are arranged corresponding to a first group and a second group that are adjacent to one another,
the bit line connection lines included in the first group are connected to the sense amplifiers included in the first sense amplifier column and are connected to half of the sense amplifiers among the sense amplifiers included in the second sense amplifier column, and
the bit line connection lines included in the second group are connected to the remaining half of the sense amplifiers among the sense amplifiers included in the second sense amplifier column and are connected to the sense amplifiers included in the third sense amplifier column.

9. The semiconductor memory device according to claim 7, wherein
the sense amplifiers arranged in the second direction are connected to the bit line connection lines at two corresponding positions in each of the groups,
and the device further comprises:
a control signal line extending in the second direction commonly connected to the sense amplifiers connected to the bit line connection lines at the corresponding positions in each of the groups; and
an output signal line extending in the first direction for transferring data read from the sense amplifiers.

10. The semiconductor memory device according to claim 9, wherein
the control signal line is positioned between the sense amplifiers adjacent in the first direction, and
one bit line connection line to which one of the sense amplifiers adjacent in the first direction is connected and another bit line connection line to which the other of the sense amplifiers adjacent in the first direction is connected are set in the same position within the different groups.

11. The semiconductor memory device according to claim 10, further comprising:
a plurality of control signal lines connected to different sense amplifiers in the first direction respectively; and
a switching signal line for switching the control signal lines.

12. The semiconductor memory device according to claim 9, wherein
the sense amplifiers connected to the bit line connection lines at corresponding positions indifferent groups are disposed adjacently in the second direction, and
two of the sense amplifiers connected to the bit line connection lines at corresponding positions in different groups and disposed adjacently in the second direction are connected to the control signal line via a common contact.

13. A semiconductor memory device, comprising:
a semiconductor substrate;
a memory cell array provided above the semiconductor substrate and including a plurality of memory cells that are stacked in a vertical direction extending away from the substrate;
a plurality of bit lines connected electrically to the plurality of memory cells; and
a plurality of sense amplifiers, wherein
each sense amplifier is connected to a respective bit line via a respective bit line connection line,
the bit line connection lines having every adjacent N lines (where N is an integer of 2 or more) as one group,
each group of bit line connection lines corresponding to a respective group of sense amplifiers,
the sense amplifiers being arranged in a number different from N in a first direction that the bit line connection lines extend, and
the memory cell array comprises a column of the sense amplifiers extending in the first direction, wherein the column includes sense amplifiers connected to bit line connection lines belonging to two adjacent groups.

14. The semiconductor memory device according to claim 13, wherein
the sense amplifiers are arranged in a second direction intersecting the first direction with a pitch that is two-thirds (⅔) of an arrangement pitch of the groups,
a first, a second, and a third sense amplifier column are arranged corresponding to a first group and a second group that are adjacent to one another,
the bit line connection lines included in the first group are connected to the sense amplifiers included in the first sense amplifier column and are connected to half of the sense amplifiers among the sense amplifiers included in the second sense amplifier column, and
the bit lines included in the second group are connected to the remaining half of the sense amplifiers among the sense amplifiers included in the second sense amplifier column and are connected to the sense amplifiers included in the third sense amplifier column.

15. The semiconductor memory device according to claim 13, wherein
the sense amplifiers arranged in the second direction are connected to the bit line connection lines at two corresponding positions in each of the groups,
and the device further comprises:
a control signal line extending in the second direction commonly connected to the sense amplifiers connected to the bit line connection lines at the corresponding positions in each of the groups; and
an output signal line extending in the first direction for transferring data read from the sense amplifiers.

16. The semiconductor memory device according to claim 15, wherein
the control signal line is positioned between the sense amplifiers adjacent in the first direction, and
one bit line connection line to which one of the sense amplifiers adjacent in the first direction is connected and another bit line connection line to which the other of the sense amplifiers adjacent in the first direction is connected are set in the same position within the different groups.

17. The semiconductor memory device according to claim 16, further comprising:
a plurality of control signal lines connected to different sense amplifiers in the first direction respectively; and
a switching signal line for switching the control signal lines.

* * * * *